United States Patent [19]

Mano et al.

[11] Patent Number: 4,482,914
[45] Date of Patent: Nov. 13, 1984

[54] CONTACT STRUCTURE OF SEMICONDUCTOR DEVICE

[75] Inventors: Toru Mano, Fukushima; Takeshi Fukuda, Kawasaki; Toshitaka Fukushima, Yokohama; Kouji Ueno, Kawasaki; Kazuo Tanaka, Machida, all of Japan

[73] Assignee: Fujitsu Limited, Kawasaki, Japan

[21] Appl. No.: 334,924

[22] Filed: Dec. 28, 1981

[30] Foreign Application Priority Data

Dec. 29, 1980 [JP] Japan ................. 55-187083

[51] Int. Cl.³ ............... H01L 29/06; H01L 29/04; H01L 23/48
[52] U.S. Cl. .................... 357/68; 357/55; 357/59; 357/65
[58] Field of Search ............ 357/68, 65, 55, 59

[56] References Cited

U.S. PATENT DOCUMENTS

| | | | |
|---|---|---|---|
| 3,534,267 | 10/1970 | Hyltin | 357/15 |
| 4,196,443 | 4/1980 | Dingwall | 357/68 |
| 4,236,171 | 11/1980 | Shen | 357/55 |
| 4,292,643 | 9/1981 | Kellner et al. | 357/68 |
| 4,322,736 | 3/1982 | Sasaki et al. | 357/68 |
| 4,360,822 | 11/1982 | Roger | 357/55 |

Primary Examiner—Andrew J. James
Assistant Examiner—J. Carroll
Attorney, Agent, or Firm—Staas & Halsey

[57] ABSTRACT

When a side of a hole formed in a layer of a semiconductor device is located on a slope of a step-like portion, the side of the hole is formed so that it has a wave shape. A conductor line traverses the wave side of the hole.

9 Claims, 16 Drawing Figures

CONTACT STRUCTURE OF SEMICONDUCTOR DEVICE

BACKGROUND OF THE INVENTION

The present invention relates to a semiconductor device and more specifically to an improved contact structure of conductor lines which lie on a rough surface of a semiconductor substrate.

In the production of a semiconductor device (e.g. IC, LSI), generally, a variety of thin layers, such as silicon dioxide ($SiO_2$), polycrystalline silicon, silicon nitride ($Si_3N_4$) and phosphosilicate glass (PSG), are used and each of the thin layers is selectively etched to form a hole (i.e. an opening) and then a conductor line of metal is formed on a thin layer so as to traverse the hole. In such a case, a side wall of the hole is sometimes located on a step or slope of a surface portion of a semiconductor substrate or an insulating layer which lies under the thin layer. Especially in the case where a higher density semiconductor device is produced, a side wall of the hole is often located on the step or slope.

For example, a thin silicon dioxide layer 1 and a thick silicon dioxide layer 2 are formed on a semiconductor substrate 3 having a step-like portion, as illustrated in FIG. 1. In order to selectively etch the thin silicon dioxide layer 1 so as to form a hole for the succeeding processing wherein a region 4 having diffused impurities of the substrate 3 is exposed, a photoresist layer 5 (FIG. 1) is formed on the thick silicon dioxide layer 2 so as to cover the upper portion of the slope of the layer 2 above the step-like portion. When etching is carried out, the thin silicon dioxide layer is removed, and, simultaneously, a side portion of the thick silicon dioxide layer 2 is removed, thereby creating a so-called overhang A, as illustrated in FIG. 2. Then a conductor line 6 comprised of metal such as aluminum is formed by means of a vacuum deposition method. However, a defect, i.e. a crack (illustrated in FIG. 2), is present in the conductor line 6 at the overhang so that the coverage of the conductor line 6 at the side of the thick silicon dioxide layer 2 (i.e. a so-called step coverage) is not good. Whether or not the conductor line 6 will break depends on the circumstances. Since an etching solution can easily enter the crack and since the conductor line 6 at the overhang is remarkably thin, the life and reliability of the semiconductor device is decreased.

In another case, a thin layer 11 of polycrystalline silicon is formed on an insulating layer 12 of silicon dioxide having a step-like portion and lies on a semiconductor substrate 13 (FIG. 3). In this case, the polycrystalline silicon layer 11 is deposited with uniform thickness by using a well-known low pressure chemical vapor deposition method. The polycrystalline silicon layer is used as the underlying layer for an aluminum conductor layer. In order to selectively remove a portion of the polycrystalline layer 11 so as to form a hole by means of a photoetching method, the other portion of the layer 11 is covered with a photoresist layer 14, as illustrated in FIG. 3. The end of the photoresist layer 14 covers the upper portion of the slope of the polycrystalline silicon layer 11. When etching is carried out, the exposed portion of the polycrystalline silicon layer 11 is removed so that a side of the hole is located on the slope of the step-like portion of the silicon dioxide layer 12, as illustrated in FIG. 4. As a result of etching, an overhang B (FIG. 4) is created on the upper part of the slope. Then a conductor line 15 (FIG. 4) of metal is formed on the polycrystalline silicon layer 11 and on the exposed thin portion of the silicon dioxide layer 12 so as to traverse the side of the hole. In this case, a defect similar to that in FIG. 2 is present in the conductor line 15 at the overhang B. In order to prevent a defect in the conductor line 15 it can be considered that the hole of the polycrystalline silicon layer 11 should be made larger so as to locate a side 16 of the larger hole away from the edge 17 of the slope of the step-like portion, as illustrated in FIGS. 5 and 6. However, since the registration tolerance must be taken into consideration, the distance L from the edge 17 of the slope of the step-like portion to the side 16 of the hole may be the sum of a predetermined distance and the maximum tolerance. In such a case, the dimensions of the hole can become too large, thereby preventing an increase in the density of the semiconductor device. In particular, when a multilayer structure is made of three or more layers, the arrangement of holes formed in different layers must be taken into consideration so that the registration tolerance can be increased. As a result, the dimensions of the holes may be increased further.

SUMMARY OF THE INVENTION

An object of the present invention is to prevent a defect in a conductor line at an overhang on a step-like portion.

Another object of the present invention is to form a hole without an additional hole portion.

Another object of the present invention is to provide a semiconductor device having a good step coverage in regard to a conductor line although a side of the hole of a layer is located on a slope of a step-like portion.

The above-mentioned objects of the present invention and other objects of the present invention are achieved by providing a semiconductor device comprising a semiconductor substrate, an insulating layer covering a surface of said semiconductor substrate and provided with an uneven surface area, an additional layer formed on said insulating layer and having a hole therein, the end of said additional layer protruding and depressing (being indented) at different and adjacent portions of the periphery of said hole, at least one of said protruding and depressing (indented) portions being located on said uneven surface area, and a wiring layer formed on said insulating layer and said additional layer, said wiring layer crossing and covering said protruding and depressing portions of said additional layer. The uneven surface of the insulating layer is formed either so that it has a thin portion and a thick portion or by covering the semiconductor substrate having a step-like portion with the insulating layer having uniform thickness.

In brief, the invention is that, in a semiconductor device comprising a layer which is formed on a surface including a step-like portion and which has a hole in it, wherein a side of the hole is located on a slope of the step-like portion and a conductor line lies on the layer and on the slope so as to traverse the side of the hole, the side of the hole has the shape of a wave.

DETAILED DESCRIPTION OF THE PREFERRED EMBODIMENTS

Figure 7:
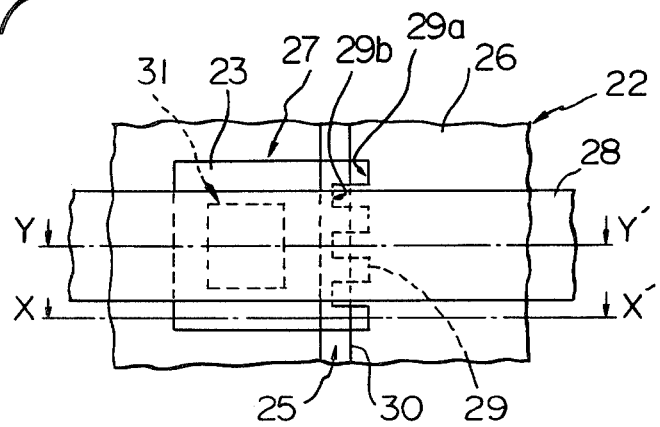
FIG. 7 is a partial plan view of a semiconductor device according to an embodiment of the present invention.
Figure 8:
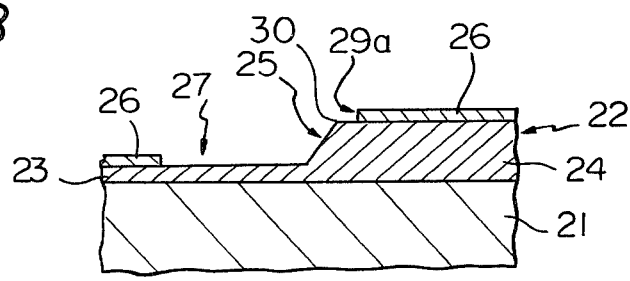
FIG. 8 is a sectional view taken along the line X—X' of FIG. 7.
Figure 9:
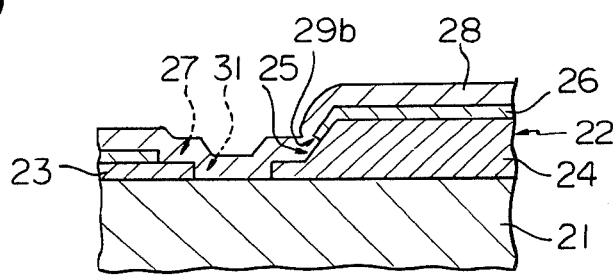
FIG. 9 is a sectional view taken along the line Y—Y' of FIG. 7.

Referring to FIGS. 7, 8 and 9, there is illustrated a part of a semiconductor device of a preferable embodiment of the present invention. The semiconductor device comprises a semiconductor substrate (e.g. a single crystalline silicon wafer) 21, an insulating layer 22 consisting of a thin $SiO_2$ layer 23 and a thick $SiO_2$ layer 24 and having a slope 25 of a step-like portion, a thin layer 26, e.g. a thin layer of polycrystalline silicon, having a hole 27, and a conductor line 28 of metal such as aluminum. A side 29 of the hole 27 has the shape of a square-like wave, as illustrated in FIG. 7. In this case, the center line of the square-like wave is the edge line 30 of the slope 25 and the flat surface of the thick $SiO_2$ layer 24. The thin $SiO_2$ layer 23 has another small hole 31 for electrical contact within the hole 27. The conductor line 28 comes into contact with the semiconductor substrate 21 within the small hole 31 and lies on the thin layer 26 and on the thin $SiO_2$ layer 23 so as to traverse the side 29 of the hole 27.

In a case where the right maximum line 29a (FIGS. 7 and 8) of the square-like wave side 29 of the hole 27 is located on the thick $SiO_2$ layer 24, the portion of the conductor line 28 traversing the line 29a has a good step coverage. On the other hand, in a case where the left maximum line 29b (FIGS. 7 and 9) of the square-like wave side 29 is located on the slope 25, the other portion of the conductor line 28 traversing the line 29b may have a slightly bad step coverage since the end of the thin layer 26 forms an overhang on the slope 25, as illustrated in FIG. 9. However, in practice, a conductor line having a bad step coverage at the overhang is substantially improved due to the shape of the side of the hole, which is like that of a square-like wave. Therefore, it is possible to obtain a conductor line having only a small defect.

It is preferable to make the width of the square-like wave of the hole from approximately 1 to approximately 4 $\mu$m and to make the amplitude of the square wave from approximately 2 to approximately 4 $\mu$m.

In order to form the square-like wave side of the hole in the thin layer, when the thin layer is selectively etched by means of a conventional photoetching method, and a photomask having a pattern including the square-like wave part only is used instead of that having a conventional pattern.

Figure 10:
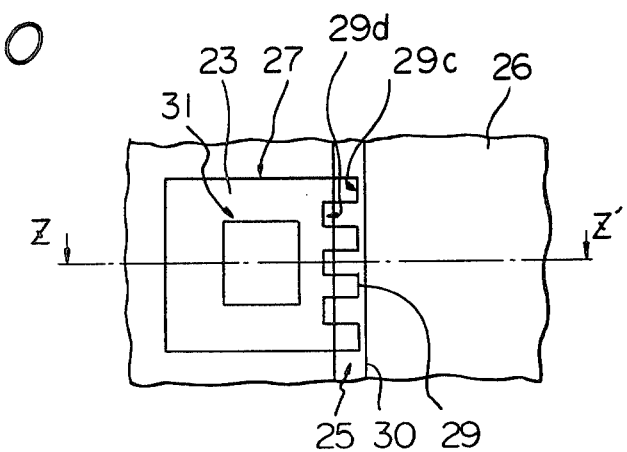
FIG. 10 is a partial plan view of the semiconductor device of FIG. 7 except that the hole has been shifted leftward and the conductor line is not illustrated.
Figure 12:
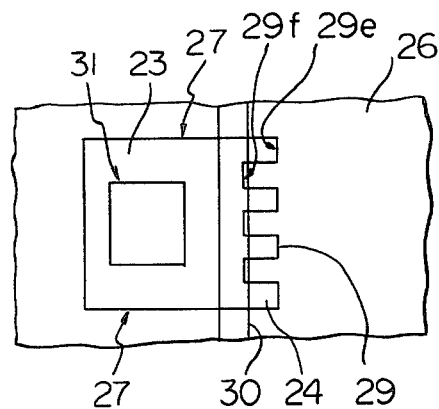
FIG. 12 is a partial plan view of the semiconductor device of FIG. 7 except that the hole has been shifted in the opposite direction and the conductor line is not illustrated.

If the location of the hole having the square-like wave side does not meet the predetermined position, for example, the two different arrangements of the hole 27 illustrated in FIGS. 10 and 12 are obtained.

Figure 1:
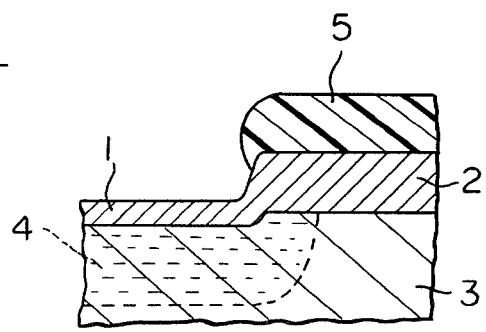
FIG. 1 is a partial sectional view of a semiconductor device of the prior art in an intermediate stage of production.
Figure 2:
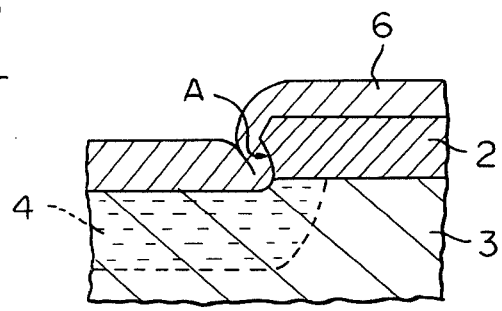
FIG. 2 is a partial sectional view of the device of FIG. 1 in a subsequent stage of production.
Figure 3:
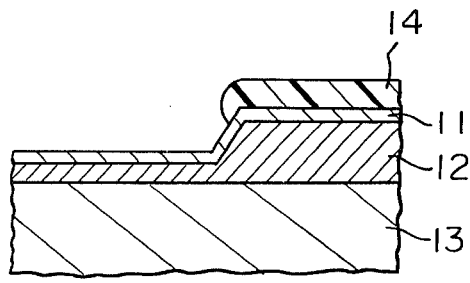
FIG. 3 is a partial sectional view of another semiconductor device of the prior art in an intermediate stage of production.
Figure 4:
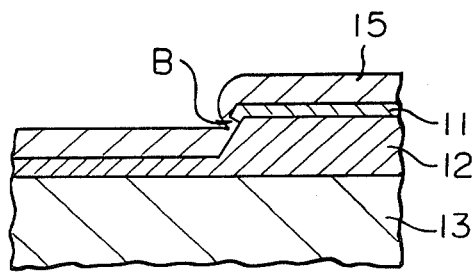
FIG. 4 is a partial sectional view of the device of FIG. 3 in a subsequent stage of production.
Figure 5:
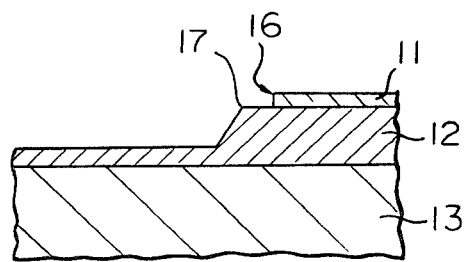
FIG. 5 is a partial sectional view of yet another semiconductor device of the prior art having a layer with a hole.
Figure 6:
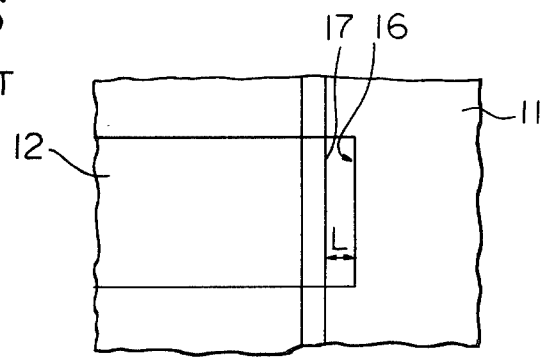
FIG. 6 is a plan view of FIG. 5.
Figure 11:
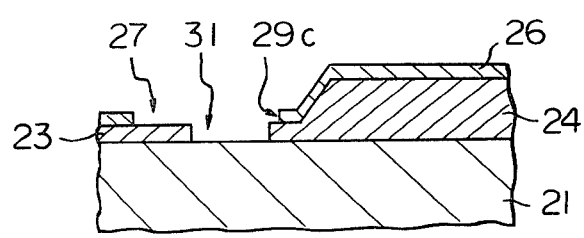
FIG. 11 is a sectional view taken along the line Z—Z' of FIG. 10.

In FIG. 10, since the hole 27 is shifted leftwardly, a right maximum line 29c of the side 29 is located on the slope 25. When a conductor line (not shown) is formed, a portion of the conductor line traversing the right maximum line portion of the side 29 has the same defect as that in the case of FIG. 4. However, since a left maximum line 29d of the side 29 is located on the thin $SiO_2$ layer 23, as illustrated in FIGS. 10 and 11, the other portion of the conductor line traversing the left maximum line 29d portion of the side 29 has no defect. Therefore, the conductor line has a good step coverage portion so that complete breakage of the conductor line cannot occur.

In FIG. 12, since the hole 27 is shifted rightwardly, a left maximum line 29f of the side 29 is located on the upper portion of the slope 25. When the conductor line (not shown) is formed, a portion of the conductor line traversing the left maximum line 29f has the same defect as that in the case of FIG. 4. However, since a right maximum line 29d of the side 29 is located on the thick $SiO_2$ layer 24, the other portion of the conductor line traversing the right maximum line 29d has no defect. Therefore, the conductor layer has a good step coverage portion so that complete breakage of the conductor line cannot occur.

Although the conditions illustrated in FIGS. 10 and 12 are most undesirable, at least half of the portion of the conductor line traversing the square-like wave side of the hole has a good step coverage. Therefore, the life and reliability of the semiconductor device according to the present invention are superior to the conventional semiconductor device. Furthermore, the square-like wave side of the hole can be easily formed by means of a conventional photoetching method. Although the side of the hole is located on a slope, the conductor line of the semiconductor device of the present invention cannot be broken, thereby contributing to the production of a denser semiconductor device.

Figure 13:
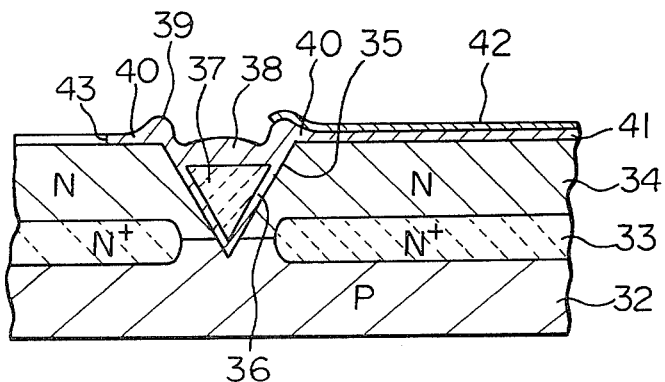
FIG. 13 is a partial sectional view of another semiconductor device according to another embodiment of the present invention.

FIG. 13 is a partial sectional view of another embodiment of the present invention. A P-type silicon substrate 32 is used as the starting material, and buried layers 33 are formed on the substrate 32 by means of a diffusion technique. Then an epitaxial layer 34 with a relatively high resistivity is formed on the substrate surface. During epitaxial growth of the layer 34, impurities in the layer 33 are diffused into the substrate 32 and the layer 34. A surface of the layer 34 is thermally oxidized to form a silicon dioxide layer, which is used as an underlying layer for anti-oxidation film such as silicon nitride.

Neither the silicon dioxide layer nor the silicon nitride layer are shown in FIG. 13. The silicon nitride layer is then etched by using a silicon dioxide layer as an etching mask in accordance with the conventional photolithographic process. The silicon nitride thus etched covers each portion of the silicon islands into which any one of the desired circuit elements is formed. The silicon nitride is used as an etching mask to etch off the exposed portion of the underlying silicon dioxide, and then the silicon substrate is selectively etched to form a V-groove 35. Surface portions of the V-groove 35 of the substrate 32 are then thermally oxidized to form an insulating layer of silicon dioxide 36. The V-groove 35 is filled with polycrystalline silicon 37 by depositing the polycrystalline silicon in a well-known, low-pressure chemical vapor deposition apparatus and then polishing the deposited silicon is carried out to remove it except for a portion lying within the V-groove 35. During polishing of the deposited silicon, the silicon nitride is used as a stopper of the polishing. Selective oxidation is carried out so as to cover the surface of the polycrystalline silicon 37 with silicon dioxide 38. During oxidation, undesirable oxidation of silicon occurs. The well-known bird's head 39 and bird's beak 40 of silicon dioxide are formed at the periphery of the V-groove 35. Then the silicon nitride used as an oxidation mask is etched off. A circuit element of an integrated circuit is provided in each of the isolated silicon islands by means of the conventional diffusion technique or ion-implantation method. One of the circuits is a programmable read only memory, and the memory cell is constructed by placing a pair of diodes back to back. Briefly, the cell is formed by a transistor-like arrangement on P-N junctions. For instance, base diffusion and emitter diffusion are carried out to form the memory cell at cell portions in the silicon islands. The emitter-base junction, for example, is broken down by an alloying electrode material for write-in. Recently, a Schottky barrier diode has been used in the peripheral circuit of the memory and is used as a short-circuiting element for connecting the base and collector of the transistor in the peripheral circuit. In one application, the diode may be used as a reference voltage element or voltage shifting element. In another application, the diode may be used as a protection diode, i.e. for protecting the integrated circuit against external noise. In each case, the diode must have the desired characteristics of forward voltage and should be manufactured without having any processing influence. We have found that Schottky barrier diodes formed by the silicon substrate and an aluminum electrode can be manufactured with a higher stability than that of diodes formed with a polycrystalline silicon and aluminum electrode. Therefore, polycrystalline silicon should be removed at the surface area under which the Schottky barrier diode is formed. Polycrystalline silicon is used in the production of a bipolar integrated circuit including the PROM. The process and advantages of using polycrystalline silicon are described in U.S. Pat. No. 4,125,426 assigned to the same assignee of the present invention.

In the process of production of the PROM, at the surface portion of the substrate where the Schottky barrier diode is formed, the substrate is covered with a silicon dioxide layer 41 before the polycrystalline silicon 42 is formed.

After deposition of the polycrystalline silicon 42, the polycrystalline silicon is photoengraved in accordance with the present invention.

Figure 14:
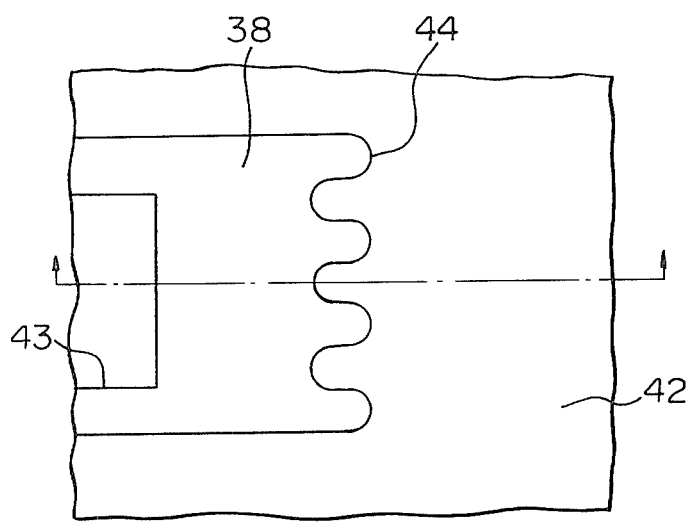
FIG. 14 is a partial plan view of the semiconductor device of FIG. 13.

FIG. 14 is a plan view of the substrate corresponding to FIG. 13.

After patterning the polycrystalline silicon 42, the silicon dioxide layer 41 is etched so as to form a hole 43 having a predetermined area for the Schottky barrier diode.

The wave end 44 may be placed on a relatively flat surface area on the polycrystalline silicon 37, but since the width of the polycrystalline silicon 37 is narrowed in the processing improvement, the above-mentioned arrangement would not be permissible. Therefore, photoengraving of the polycrystalline silicon 42 must be carried out on the rough surface of the substrate. Even in such case, the aluminum wiring to be layered on the polycrystalline silicon 42 will not be broken. In addition, another metal, such as titanium, may be placed between the substrate of silicon and the aluminum wirings. In that case, the diode characteristics are superior to those of the silicon-aluminum contact in regard to forward voltage and processing stability.

The advantage of providing the polycrystalline silicon end with a in the shape of a wave form in the vicinity of the protruding portion is that a defect cannot be seen during the visual check step. On the contrary, in the case of the conventional process without the wave-like form, the polycrystalline silicon end produces a failure rate of one lot in four lots in the visual test.

An other preferred embodiment is now described with reference to FIGS. 15 and 16.

Figure 15:
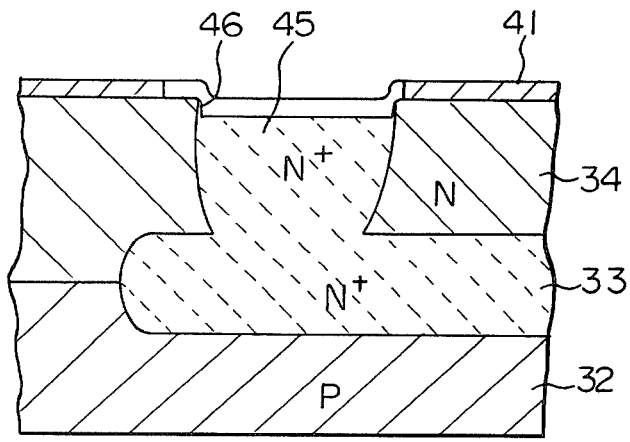
FIG. 15 is a partial sectional view of an integrated circuit according to the other embodiment of the present invention.
Figure 16:
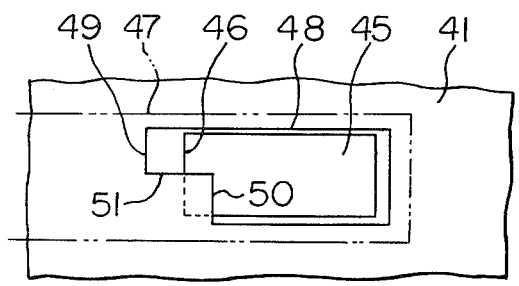
FIG. 16 is a partial plan view of the integrated circuit of FIG. 15.

FIG. 15 shows a partial cross-sectional view of an integrated circuit in accordance with the present invention, and FIG. 16 is a plan view corresponding to FIG. 15.

This example is a contact structure for the collector contact in a circuit. The bipolar integrated circuit comprises a bipolar transistor with a collector contact region 45. The collector contact region 45 is provided so as to decrease series resistance, including ohmic contact resistance, and is usually formed during emitter diffusion. During emitter diffusion, the surface of the region 45 is oxidized and the silicon step 46 is always formed. Then, a contact hole must be formed to allow a wiring 47 to make contact with the region 45. If the contact hole is located in the surface area over the region 45, the region 45 must be large enough to place the hole in it, thereby involving unnecessary surface area of the silicon. If the region 45 has too small a surface area, the contact hole cannot be formed on the surface of the region 45. Therefore, the contact hole must be large enough to include the surface of the region 45. This also results into the occupation of unnecessary silicon surface.

In the present invention, a contact hole 48 having a protrusion 49 and a depression 50 is formed. The step portion 51 traverses the region 45, and the distance between the protrusion 49 and depression 50 may be about two microns, almost coinciding with the registration tolerance of the photomask. The contact hole 48 may have a variable location with respect to the region 45 in the range of the registration tolerance. However, contact between the wiring 47 and the region 45 is always guaranteed in the manner as described with respect to FIGS. 7 through 12.

It will be obvious that the present invention is not restricted to the above-mentioned embodiments and that it is possible for many variations to be made by those skilled in the art without departing from the scope of the present invention.

We claim:
1. A semiconductor device comprising:
a semiconductor substrate;
an insulating layer covering a surface of said semiconductor substrate and having a a sloped portion and a contact hole;
an additional layer formed on said insulating layer and having a hole therein corresponding to said contact hole in said substrate layer, a side of the perimeter of said hole in said additional layer winding on said sloped portion of said insulating layer and on a side of said sloped portion to define protruding and indented portions of said additional layer; and
a wiring layer formed on said insulating layer and additional layer to contact said semiconductor substrate thru said contact hole in said insulating layer and said hole in said additional layer, said wiring layer covering said protruding and indented portions of said additional layer and the exposed portions of said insulating layer therebetween.

2. A semiconductor device as recited in claim 1, said protruding and indented portions having a geometric form in the shape of a wave extending along said sloped portion and said side thereof.

3. A semiconductor device as recited in claim 2, wherein said form in the shape of a wave is substantially a square wave.

4. A semiconductor device as recited in claim 1, wherein said insulating layer is a thermally oxidized silicon dioxide layer and said additional layer is a polycrystalline silicon layer.

5. A semiconductor device as recited in claim 1, wherein said insulating layer includes a thin portion and a thick portion and said sloped portion of said insulating layer is formed between said thin portion and said thick portion, and said contact hole in said thin portion.

6. A semiconductor device as recited in claim 1, wherein said semiconductor substrate has a step-like and said sloped portion of said insulating layer is formed by covering said step-like portion of said semiconductor substrate with said insulating layer.

7. A semiconductor device comprising:
a semiconductor substrate having a step-like portion;
an insulating layer on said semiconductor substrate, having a contact hole and covering said step-like portion of said semiconductor substrate, a side of the perimeter of said contact hole winding across said step-like portion of said semiconductor substrate to define protruding and indented portions of said insulating layer at adjacent portions of the periphery of said contact hole, over said step-like portion of said semiconductor substrate,; and
a contact layer formed on said insulating layer and on the exposed portion of said semiconductor substrate in said contact hole, said contact layer crossing and covering said protruding and indented portions of said insulating layer.

8. A semiconductor device as recited in claim 7, said protruding and indented portions of said insulating layer having a geometric form in the shape of a wave.

9. A semiconductor device as recited in claim 8, wherein said form in the shape of a wave is substantially a square wave.

* * * * *